United States Patent [19]
Dierks et al.

[11] Patent Number: 5,650,630
[45] Date of Patent: Jul. 22, 1997

[54] MERCURY VAPOR HIGH-PRESSURE DISCHARGE LAMP AND IRRADIATION METHOD, PARTICULARLY FOR MASK PATTERN EXPOSURE OF SEMICONDUCTOR WAFERS

[75] Inventors: Joern Dierks; Juergen Maier, both of Berlin, Germany

[73] Assignee: Patent-Treuhand-Gesellschaft F. Elektrische Gluehlampen MBH, Munich, Germany

[21] Appl. No.: 410,724

[22] Filed: Mar. 27, 1995

[30] Foreign Application Priority Data

Mar. 29, 1994 [DE] Germany .............. 44 10 968.7

[51] Int. Cl.⁶ .............. H01J 17/16; H01J 37/00
[52] U.S. Cl. .............. 250/492.1; 313/636
[58] Field of Search .............. 250/492.1, 492.2; 313/636

[56] References Cited

U.S. PATENT DOCUMENTS

| | | |
|---|---|---|
| Re. 30,165 | 12/1979 | Mason et al. .............. 313/221 |
| 2,862,131 | 11/1958 | Escher-Desrivieres .............. 313/112 |
| 3,253,174 | 5/1966 | Elmer et al. . | 
| 3,902,091 | 8/1975 | Mason et al. .............. 313/221 |
| 4,732,842 | 3/1988 | Kira . |
| 4,985,275 | 1/1991 | Takemura et al. . |

*Primary Examiner*—Bruce Anderson
*Attorney, Agent, or Firm*—Frishauf, Holtz, Goodman, Langer & Chick, P.C.

[57] ABSTRACT

To eliminate radiation from the mercury high-pressure discharge lamp of wavelengths below 365 nm, the lamp includes a discharge vessel of quartz glass which is doped with vanadium in a quantity of up to about only 250 ppm, by weight, with respect to 1 mm of wall thickness of the quartz glass. This absorbed radiation also heats the quartz glass, so that the outside wall temperature of the vessel can be maintained between about 400° and 950° C. The effect can be enhanced by adding, additionally, titanium and/or tin to provide metal ions to the doping substance, in an overall quantity of up to 500 ppm, by weight. Alternatively, the quartz glass can be coated with $TiO_2$ or $SnO_2$. Suitable wall thicknesses for the discharge vessel are between 1 and 5 mm, and the fill therein is preferably mercury in a quantity of between 0.5 and 15 $mg/cm^3$ and xenon with a cold fill pressure of 0.1 to 2.5 bar. Electrode spacing of the lamp is preferably between 2 and 5 mm. The vanadium portion preferably is less than 200 ppm and may, most desirably, be between 20 and 150 ppm, with respect to 1 mm wall thickness of the quartz glass of the discharge vessel.

11 Claims, 3 Drawing Sheets

MERCURY VAPOR HIGH-PRESSURE DISCHARGE LAMP AND IRRADIATION METHOD, PARTICULARLY FOR MASK PATTERN EXPOSURE OF SEMICONDUCTOR WAFERS

FIELD OF THE INVENTION

The present invention relates to a mercury vapor high-pressure discharge lamp, a method of irradiation of a mask pattern on a semiconductor wafer, and to an irradiation system for semiconductor wafers, and, particularly, to such a system and a method in which the spectral resonance line or lines of primary utility for such radiation is or are available, while unwanted lower spectral lines are effectively suppressed.

BACKGROUND

High-pressure discharge lamps which provide light from vaporized mercury should provide effective light at a wavelength of 365 nm. This spectral line is also known as the I-line. Use of radiation at 365 nm permits high resolution of a mask work which is being irradiated. Some masks can also utilize the next higher effective spectral line at 436 nm wavelength. Details of the exposure methods and lamps used therein are described in the referenced U.S. Pat. No. 4,732,842, Kira, the disclosure of which is hereby incorporated by reference.

Lamps of this type have a problem in that they do not only radiate along the desired spectral radiation lines, for example, 436 nm and, especially, 365 nm, but, further, provide undesired radiation of wavelengths which are below 365 nm. Radiation at such lower wavelengths loads the overall system. These spectral components of lower wavelengths should, preferably, be suppressed. The customary way to suppress these lower wavelengths is the use of a filter in the radiation path—see, for example, the referenced Kira U.S. Pat. No. 4,732,842. Either an interference filter or a light color filter specific to the radiation to be suppressed can be used. When an interference filter is used, absorption gaps may result which is a disadvantage. These gaps occur due to adjacent maxima of the layer stack; when using a filter, loss of overall radiation intensity must be accepted.

As the exposure technology has been further developed and higher power lamps have been developed, for example, up to 5 kw or more, problems with respect to the undesired extra shortwave radiation assume increasing importance. The thermal loading, due to radiation absorption of the overall illumination system, forms a problem. Likewise, damage due to radiation itself, also known as solarization within the system and, especially, production of ozone by the lamp, form additional problems. Ozone production results in a chemical reaction, which may cause deposits on the optical components of the illumination system. Reactions due to ultraviolet radiation also occur, based in general on the ultraviolet content of the overall wavelength region below 365 nm.

It has previously been proposed to suppress ultraviolet (UV) spectral components in incandescent lamps by using doping materials for the lamp bulb. Usually, the lamp bulb is made of VYCOR (Reg. TM) or of hard glass. Incandescent lamps, however, provide continuous radiation of low intensity which rapidly decreases towards the lower wavelength. The referenced U.S. Pat. No. 3,253,174, Elmer et al., describes an incandescent lamp in which metal ions are used as doping materials of the glass. The doping materials are vanadium, cerium or molybdenum, employed in a quantity of between about 300 to 3000 ppm (by weight). The quantity described is with respect to a glass envelope of 1 mm thickness. This doping is used in a range of to about 300 nm and below. Surprisingly, it has been found that this doping is not suitable to solve the problem with mercury vapor high-pressure discharge lamps, since it already substantially dampens the desired radiation at 365 nm.

It has also been proposed to coat lamps with titanium dioxide, $TiO_2$, see U.S. Pat. No. 4,985,275, Takemura et al. This coating, however, is effective primarily below about 240 nm and, due to the substantial distance from the desired radiation, can, at best, only be used as an additional additive.

THE INVENTION

It is an object to provide a mercury high-pressure discharge lamp which provides useful radiation at the mercury I-line of about 365 nm with no, or only very little damping, while effectively suppressing undesired radiation of wavelengths below the desired radiation of 365 nm.

Briefly, the lamp has a discharge vessel of quartz glass, retaining two electrodes spaced from each other to strike an arc. The discharge vessel retains a fill which includes mercury and xenon. The fill in the lamp, the discharge vessel and the electrodes are so arranged that when the lamp is operating, the mercury in the fill will provide a plurality of spectral resonance lines of radiation, including a desired resonance line having a wavelength of about 365 nm. Further radiation spectral lines below 365 nm will also be present. In accordance with the present invention and to absorb the radiation having wavelengths below 365 nm, the quartz glass of the discharge vessel is doped with vanadium, in a quantity of up to only about 250 ppm (parts per million) by weight, with respect to a wall thickness of quartz glass of the vessel of 1 mm. In operation, the temperature at the outside of the wall of the discharge vessel (2) is maintained between about 400° C. and 950° C.

The quartz glass, in accordance with the present invention, permits essentially undamped passage of the desired radiation emission of about 365 nm or longer wavelengths, effectively suppressing undesired emission lines below 365 nm. These undesired emission lines are close to the desired line of 365 nm.

The very small quantity of vanadium, which is added in the form of an oxide, absorbs the radiation of the lower wavelength. The quantity of 250 ppm, related to 1 mm wall thickness of the quartz glass, has been found to be sufficient. If the thickness of the wall is greater, the doping content can be reduced in essentially linear fashion.

Using higher quantities of doping would dampen the desired wavelength of 365 nm and, additionally, result in undesired absorption of radiation within the visible spectrum. A preferred upper limit of doping is 200 ppm. Doping levels of less than 150 ppm may be sufficient for lower powered lamps. A practical lower limit for the effectiveness of the absorption is approximately 20 ppm. If the lamp power is higher, a higher doping level should be selected.

The behavior of absorption can be improved in the very short wavelength range, that is, below about 300 nm or 250 nm, respectively, by the addition of tin or titanium in the form of oxides. A suitable doping quantity, related to 1 mm wall thickness of the glass vessel, is up to about 500 ppm (by weight). Both tin or titanium, added in the form of oxides of tin or titanium, can be used at the same time.

Alternatively, at least one of tin or titanium or, rather, tin oxide or titanium oxide, can be applied to the wall of the vessel in form of a coating.

Preferably, the discharge vessel has a wall thickness of between one and five mm; particularly suitable values are about 1.5 to 4 mm.

High intensity of desired wavelength is obtained by using a fill of between about 0.5 to 15 mg/cm$^3$ of mercury. A starting gas, xenon, is preferred, with a cold fill pressure of between 0.1 and 3 bar. Preferably, the pressure should be below 2.0 bar. The spacing of the electrodes within the discharge vessel is, preferably, between about 2 and 9 mm.

In operation, the temperature measured at the outer wall of the discharge vessel or bulb, reaches values of between 400 and 950 C. The temperature must be considered because the exact position of the absorption edge of the vanadium is temperature dependent.

Other types of discharge lamps in which only a portion of the ultraviolet (UV) emission is to be utilized can also be made with quartz discharge vessels doped with vanadium in small quantities, as described above.

The quantities of doping metals which provide the metal ions are based on a 1 mm thick glass envelope, discharge vessel or lamp bulb. Roughly speaking, as well known, the effectiveness increases linearly with wall thickness, whereby the percent content required for a given effect decreases for small thicknesses as the wall thickness increases. Thus, an envelope of 2 mm wall thickness containing 50 ppm of a given metal ion will be the equivalent of a 1 mm wall envelope containing 100 ppm of the ion.

DRAWINGS

FIGS. 2a, 2b and 2c illustrate spectral distribution, in which

FIG. 2a shows the spectral distribution of emitted radiation of a prior art lamp;

FIG. 2b illustrates, highly schematically, the relative absorption behavior of the doping in accordance with the present invention; and FIG. 2c illustrates the spectral output of the lamp in accordance with the present invention.

DETAILED DESCRIPTION

Figure 1:
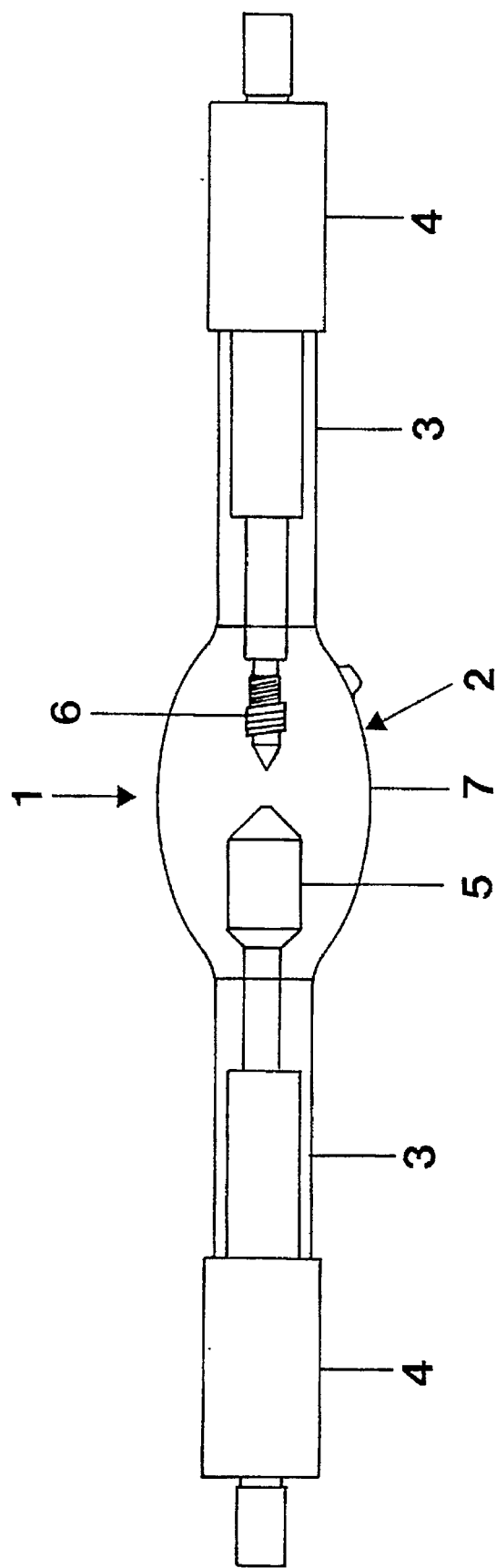
FIG. 1 is a highly schematic side view of a discharge lamp in accordance with the present invention.

FIG. 1, highly schematically, illustrates a mercury vapor high-pressure discharge lamp 1, having a discharge vessel, envelope or bulb 2 of quartz glass, which has two extending shaft portions 3 to which suitable bases 4 are connected. The lamp is a dc lamp. The discharge vessel 2 is quartz glass having a wall thickness of about 2.8 mm.

Lamp Data and Radiation:

EXAMPLE 1

Lamp power: 1000 W.

Electrode spacing between anode 5 and cathode 6: 3 mm.

Wall thickness: 2.8 mm.

Doping of quartz glass of discharge vessel: vanadium oxide, in which the vanadium itself is present in a quantity of about 35 ppm.

Fill: 8 mg/cm$^3$ mercury and xenon with a cold-fill pressure of 1.7 bar.

Operating temperature of the bulb 2, measured at the outside of the bulb: up to 750° C.

The bulb is coated at the outside with a coating 7 of $TiO_2$. Thickness of coating layer 7: 1 μm.

Figure 2A:
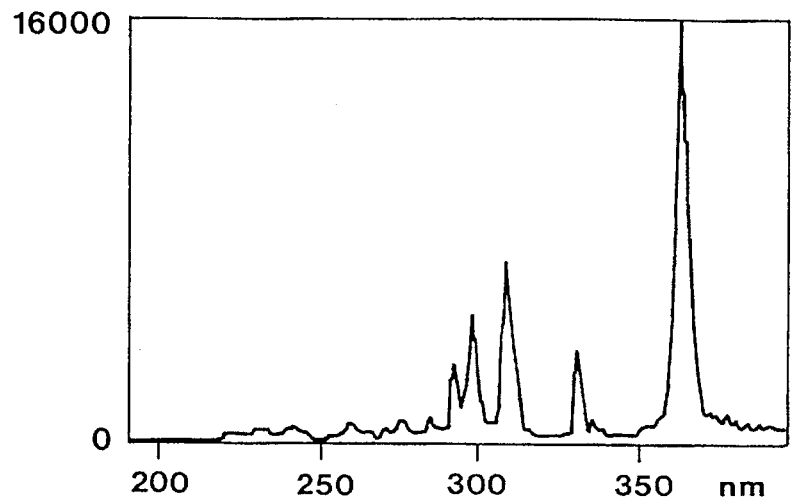
Figure 2B:
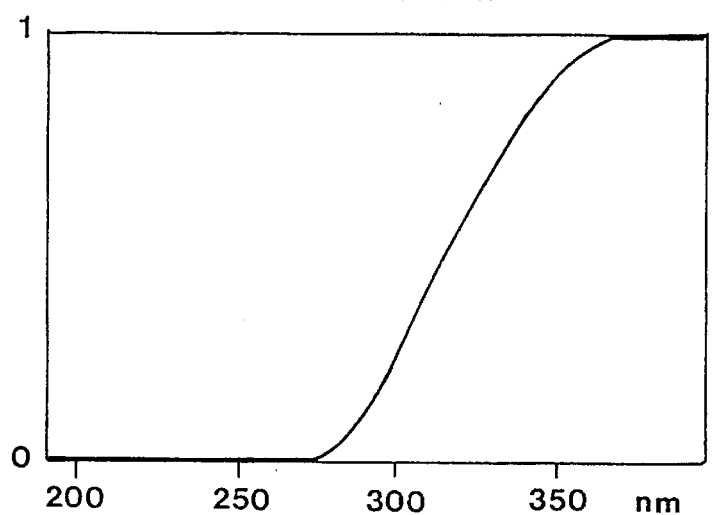
Figure 2C:
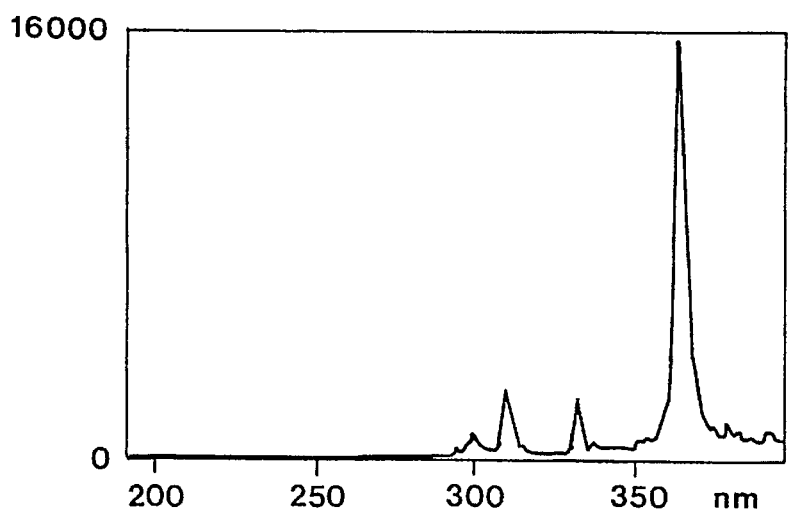

FIG. 2a illustrates a portion of the emitted lamp spectrum between 200 and 400 nm of a lamp as illustrated in FIG. 1 in which, however, the glass of the discharge vessel 2 is not doped. This is a prior art lamp. FIG. 2b illustrates the absorption behavior of the doping in accordance with the present invention of the lamp as shown in FIG. 1, with the doped glass of the bulb 2. The spectrum of emitted radiation is shown in FIG. 2c.

A comparison of FIGS. 2a and 2c clearly shows that radiation below 365 nm is effectively absorbed by the bulb. Further, it is clearly seen that the desired radiation wavelength at 365 is not damped. The undesired group of radiation lines, at about 300 nm, 5 however, are highly damped. Adding $SnO_2$ can improve the suppression of radiation around 300 nm even further.

EXAMPLE 2

The lamp has the general configuration shown in FIG. 1.

Power rating: 3,300 W.

Fill: mercury 3 mg/cm$^3$ and xenon with a cold-fill pressure of 0.8 bar.

Spacing of electrodes, that is, between anode 5 cathode 6: 6.5 mm. The envelope or discharge vessel or bulb 2 has a wall thickness of 3.7 mm and the glass is doped with vanadium in a quantity of 50 ppm and titanium in a quantity of 40 ppm, both vanadium and titanium being supplied in form of their respective oxides.

Figure 3:
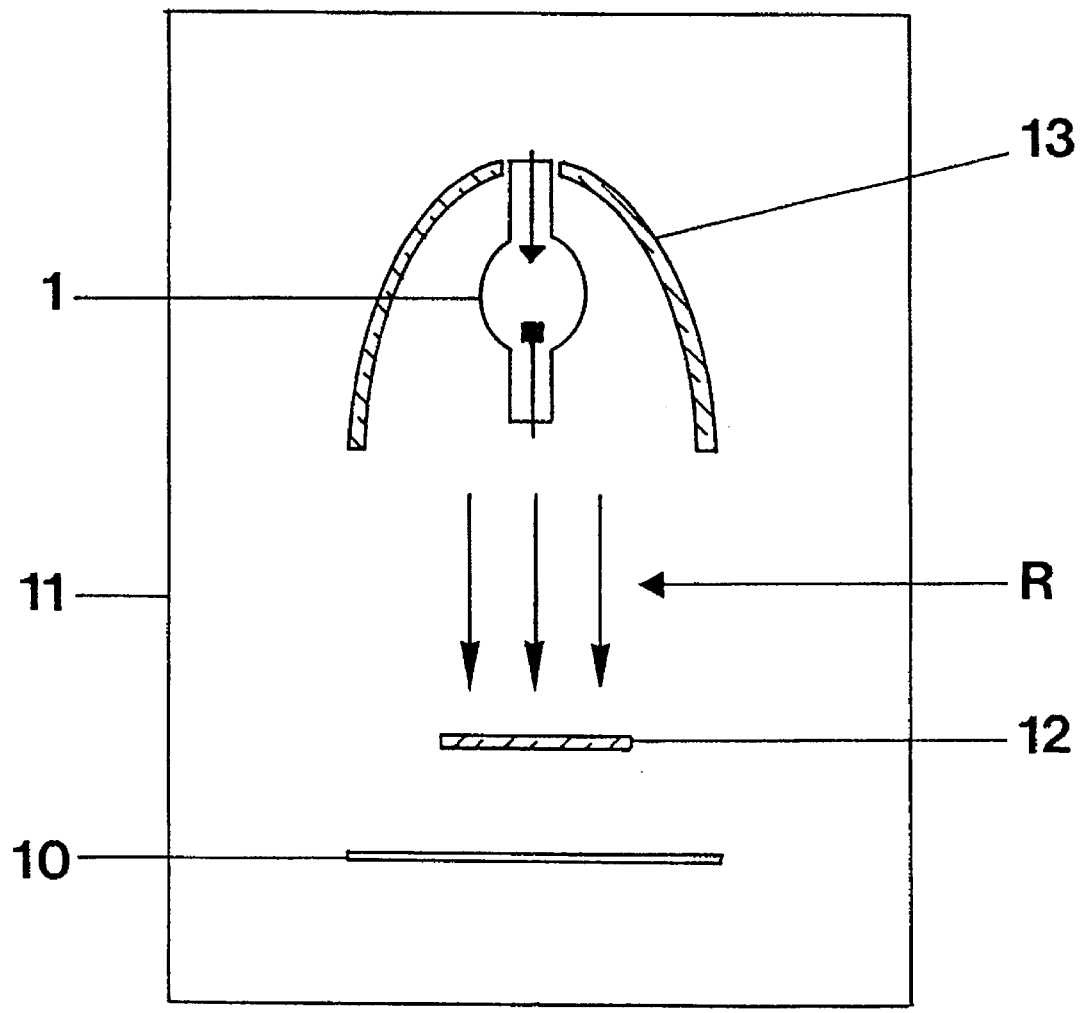
FIG. 3 shows the lamp arranged in a system for irradiation of a semiconductor wafer.

The lamps in accordance with the present invention permit substantial reduction of the costs of an overall system. Such an overall system is schematically shown as FIG. 3, in which a semiconductor wafer 10 positioned to be irradiated by the lamp 1 arranged in a reflector 13 is located within a housing structure 11. The radiation, schematically shown by the arrows R, undergoes optical projection by the system 12. The wafer 10, as is usual in such processes, is coated with an ultraviolet sensitive photo-resist film to which mask features have been transferred. U.S. Pat. No. 4,732,842, Kira, is here referred to. The lamps in accordance with the present invention permit substantial reduction in the cost of the overall system, since external blocking filters for the UV region can be substantially simplified or omitted entirely. Damage to the projection system 12 and to the housing structure 11 due to short wavelength UV radiation is minimized. The overall system efficiency, its handling capacity and its lifetime, is also increased. The lamp, in the system, has an entirely unexpected positive side effect. The increased absorption of short-wave UV radiation within the lamp has the tendency to heat the lamp bulb. This effect can be used to increase the lamp volume without danger of encountering mercury condensation. Increased lamp volume decreases the tendency to blackening of the bulb or envelope or discharge vessel.

In a preferred form of the invention, the vanadium proportion is less than 200 ppm, and most desirably between 20 and 150 ppm. Adding to the quartz glass additionally titanium and/or tin as metal ions within the doping substance, in a total value of up to about 500 ppm, enhances the suppression effect.

Alternatively, the discharge vessel 2 can be coated with $TiO_2$ or $SnO_2$. Mercury is filled in a quantity of between 0.5 and 15 mg/cm$^3$, and the starting gas, preferably xenon, has a cold fill pressure of between 0.1 to 2.5 bar.

VYCOR (Reg. TM) is a glass which has by weight up to 3.5% $B_2O_3$, up to 0.3% $Al_2O_3$, the balance being $SiO_2$. Impurity of $Na_2O$ is below 0.03%.

We claim:

1. Mercury high-pressure discharge lamp (1) having a selectively suppressed radiation emission spectrum, said lamp comprising a discharge vessel (2);

two electrodes (5, 6), spaced from each other, located within the discharge vessel;

a fill including xenon and mercury within the discharge vessel (2), said electrodes and fill in the discharge vessel being arranged therein so that, in operation of the lamp, the mercury of the fill will provide spectral resonance lines of radiation including a resonance line having a wavelength of about 365 nm, and further radiation resonance lines below 365 nm, wherein, for absorption of radiation having wavelengths below 365 nm, said vessel (2) comprises quartz glass doped with vanadium in a quantity of up to about only 250 ppm, by weight, with respect to 1 mm of wall thickness of the quartz glass of the discharge vessel; and wherein, in operation, the outside wall temperature of the discharge vessel (2) is between about 400° and 950° C.

2. The lamp of claim 1, wherein the proportion of vanadium is less than 200 ppm, related to 1 mm wall thickness.

3. The lamp of claim 1, wherein the proportion of vanadium is between about 20 and 150 ppm, related to 1 mm wall thickness of the discharge vessel.

4. The lamp of claim 1, wherein the quartz glass additionally is doped with metal ions, wherein the metals supplying the ions are titanium, or tin, or titanium and tin, and wherein the overall quantity of the additional metal ions are present up to about 500 ppm, by weight, relative to 1 mm wall thickness of the discharge vessel (2).

5. The lamp of claim 1, wherein the discharge vessel (2) is coated with at least one of: $TiO_2$ and $SnO_2$.

6. The lamp of claim 1, wherein the wall thickness of the discharge vessel is between 1 mm and 5 mm.

7. The lamp of claim 1, wherein the mercury of the fill is present in a quantity of between about 0.5 and 15 mg/cm$^3$, and the xenon in the fill has a cold fill pressure of between 0.1 and 2.5 bar.

8. The lamp of claim 1, wherein the spacing of the electrodes (5, 6) is between about 2 and 9 mm.

9. A semiconductor irradiation system, comprising a housing (11);

a semiconductor wafer (10) located within the housing; and the mercury high-pressure discharge lamp as claimed in claim 1 within the housing, positioned to project (12) radiation (R) onto said semiconductor wafer (10), the radiation having wavelengths of about 365 nm and higher only.

10. A method of irradiating a semiconductor wafer (10), comprising the steps of providing a high-pressure mercury discharge lamp (1) having a discharge vessel (2) of quartz glass;

two electrodes (5, 6), spaced from each other, located within the discharge vessel;

a fill including xenon and mercury within the discharge vessel (2), said electrodes and fill in the discharge vessel being arranged therein so that, in operation of the lamp, the mercury of the fill will provide spectral resonance lines of radiation including a resonance line having a wavelength of about 365 nm, and further radiation resonance lines below 365 nm;

and further comprising the steps of absorbing radiation of wavelengths below 365 nm within the quartz glass of the discharge vessel, whereby the discharge vessel will be heated; and the step of maintaining the outside of the discharge vessel (2) of a temperature between about 400° and 950° C.

11. The method of claim 10, wherein said step of absorbing radiation of wavelengths below 365 nm within the glass of the discharge vessel comprises doping the glass of the discharge vessel with vanadium in a quantity of up to about only 250 ppm, by weight, with respect to 1 mm of wall thickness of the quartz glass of the discharge vessel.

* * * * *